(12) United States Patent
Philipp

(10) Patent No.: US 6,466,036 B1
(45) Date of Patent: Oct. 15, 2002

(54) CHARGE TRANSFER CAPACITANCE MEASUREMENT CIRCUIT

(76) Inventor: Harald Philipp, 7 Cirrus Gardens, Hamble Hampshire SO31 4RH (GB)

( * ) Notice: Subject to any disclaimer, the term of this patent is extended or adjusted under 35 U.S.C. 154(b) by 0 days.

(21) Appl. No.: 09/390,869

(22) Filed: Sep. 7, 1999

Related U.S. Application Data
(60) Provisional application No. 60/109,889, filed on Nov. 25, 1998.

(51) Int. Cl.[7] .............................................. G01R 27/26
(52) U.S. Cl. ....................................... 324/678; 324/658
(58) Field of Search .............................. 324/678, 658, 324/661, 663, 665, 676, 679

(56) References Cited

U.S. PATENT DOCUMENTS

| | | | | |
|---|---|---|---|---|
| 3,886,447 A | * | 5/1975 | Tanaka ........................ 324/678 |
| 4,054,833 A | * | 10/1977 | Briefer ........................ 324/679 |
| 4,806,846 A | | 2/1989 | Kerber ........................ 324/678 |
| 4,977,480 A | * | 12/1990 | Nishihara .................. 73/724 X |
| 5,329,239 A | * | 7/1994 | Kindermann et al. ....... 324/678 |
| 5,343,157 A | * | 8/1994 | Deschamps ................. 324/678 |
| 5,537,054 A | * | 7/1996 | Suzuki et al. ............... 324/770 |
| 5,705,807 A | * | 1/1998 | Throngnumchai et al. .. 250/214 P |
| 5,726,581 A | * | 3/1998 | Vranish ....................... 324/688 |
| 5,730,165 A | | 3/1998 | Philipp .......................... 137/1 |
| 6,188,228 B1 | * | 2/2001 | Philipp ........................ 324/658 |
| 6,242,927 B1 | * | 6/2001 | Adams et al. .............. 324/664 |
| 6,278,283 B1 | * | 8/2001 | Tsugai ......................... 324/678 |

OTHER PUBLICATIONS

"Capacitive Sensors and Sensing Theory," Product Catalog, Gordon Products, Inc., Brookfield, CT, USA, Oct. 1997.*

* cited by examiner

Primary Examiner—N. Le
Assistant Examiner—T. R. Sundaram
(74) Attorney, Agent, or Firm—David Kiewit

(57) ABSTRACT

Pulse circuits for measuring the capacitance to ground of a plate may be used in control equipment to provide an indication of the proximity of a person or object to be sensed. Pulse circuits are disclosed that are made from sets of three or more electrical switching elements arranged so that each of the switching elements has one side electrically connected to either a supply voltage or to an electrical ground. These arrangements are compatible with existing integrated circuit fabrication technology. In addition, the circuitry can be configured as a proximity sensing switch that requires only a two wire connection to a host apparatus.

39 Claims, 14 Drawing Sheets

| STEP | S1 | S2 | S3 | FUNCTION |
|---|---|---|---|---|
| A | - | X | X | RESET ALL |
| B | - | - | - | DEADTIME |
| C | X | - | - | CHARGE-TRANSFER |
| D | - | - | - | DEADTIME |
| E | - | X | - | HOLD |
| F | - | X | - | MEASURE |

LOOP (B→E)

| STEP | S1 | S2 | S3 | FUNCTION |
|------|----|----|----|----------|
| A | X | - | X | RESET ALL |
| B | - | - | - | DEADTIME |
| C | - | X | - | CHARGE |
| D | - | - | - | DEADTIME |
| E | X | - | - | TRANSFER |
| F | X | - | - | MEASURE |

(LOOP from B to E)

| STEP | S1 | S2 | S3 | FUNCTION |
|------|----|----|----|----------|
| A | - | X | X | RESET ALL |
| B | - | - | - | DEADTIME |
| C | X | - | - | CHARGE-TRANSFER |
| D | - | - | - | DEADTIME |
| E | - | X | - | HOLD |
| F | - | X | - | MEASURE (HOLD) |

LOOP (B→E)

| STEP | S1 | S2 | S3 | FUNCTION |
|------|----|----|----|----------|
| A | - | X | X | RESET Cs, CHARGE Cx |
| B | - | - | - | DEADTIME |
| C | - | X | - | CHARGE |
| D | - | - | - | DEADTIME |
| E | X | - | - | TRANSFER |
| F | X | - | - | MEASURE |

LOOP (B → E)

|  |  |  |  |  |  | Cx FUNCTION | |
| --- | --- | --- | --- | --- | --- | --- | --- |
| STEP | S1 | S2 | S3 | S4 | Cx1 | | Cx2 |
| A | - | X | - | X | RESET | | RESET |
| B | - | - | - | - | DEADTIME | | DEADTIME |
| C | X | - | - | - | CHARGE | | CHG-TRANS |
| D | - | - | - | - | DEADTIME | | DEADTIME |
| E | - | - | - | X | TRANSFER | | HOLD |
| F | - | - | - | - | DEADTIME | | DEADTIME |
| G | - | - | - | X | | MEASURE 2 | |
| G' | X | - | - | - | | MEASURE 1 | |

LOOP: B→C→D→E

*FIG. 12*

|  |  |  |  |  |  | Cx FUNCTION | |
| --- | --- | --- | --- | --- | --- | --- | --- |
| STEP | S1 | S2 | S3 | S4 | Cx1 | | Cx2 |
| A | - | X | - | X | RESET | | RESET |
| B | - | - | - | - | DEADTIME | | DEADTIME |
| C | - | - | X | - | CHG-TRANS | | CHARGE |
| D | - | - | - | - | DEADTIME | | DEADTIME |
| E | - | X | - | - | HOLD | | TRANSFER |
| F | - | - | - | - | DEADTIME | | DEADTIME |
| G | - | X | - | - | | MEASURE 2 | |
| G' | - | - | X | - | | MEASURE 1 | |

LOOP: B→C→D→E

*FIG. 13*

CHARGE TRANSFER CAPACITANCE MEASUREMENT CIRCUIT

CROSS REFERENCE TO RELATED APPLICATIONS

This application claims the priority o of a U.S. Provisional Application for Patent filed on Nov. 25, 1998 and having Ser. No. 60/109,889.

STATEMENT REGARDING FEDERALLY SPONSORED RESEARCH OR DEVELOPMENT

Not Applicable

BACKGROUND OF THE INVENTION

1. Field of the Invention

The invention pertains to the sensing or measurement of electrical capacitance, and in particular to the sensing an object's proximity to or contact with a sense plate connected to a capacitance measurement circuit 2. Background Information In his U.S. Pat. No. 5,730,165, the inventor teaches a capacitive field sensor employing a single coupling plate and a method of detecting a change in capacitance of the coupling plate, Cx, to ground. The apparatus taught in U.S. Pat. No. 5,730,165 comprises pulse circuitry for charging the coupling plate and for subsequently transferring the charge from the plate into a charge detector, which may be a sampling capacitor, Cs. The transferring operation is carried out by means of a transfer switch electrically connected between the coupling plate and the charge detector. The disclosure of U.S. Pat. No. 5,730,165 is herein incorporated by reference.

In U.S. Pat. No. 4,806,846, Kerber teaches a pulse circuit for measuring an unknown capacitance. His arrangement is characterized by careful elimination of effects of stray capacitances, such as a capacitance to ground. Kerber employs two clocked switches and a buffer amplifier to charge and discharge the capacitor under test.

BRIEF SUMMARY OF THE INVENTION

The invention provides apparatus and method for measuring an absolute or relative value of the capacitance of a capacitor or other element having the electrical property of capacitance, as well as for measuring changes in a capacitive value. In many uses of interest, a change in the capacitance to ground of a sense plate is measured and a control output is generated responsive to the change.

A feature of some embodiments of the invention is the provision of novel pulse circuitry for measuring capacitance to ground, the circuitry comprising a plurality of electrical switching elements, each of which has one side electrically connected to either a power supply voltage or to a circuit ground point. This circuit arrangement is more compatible with available integrated circuit design and manufacturing practices than is prior art pulse circuitry, which commonly had one side of at least one switching element floating. These improved arrangements thereby provide superior performance at a lower manufacturing cost.

Another aspect of the invention is that it provides a proximity sensing means having only two electrical wires connecting it to a host apparatus. This sensing means can directly replace a magnetic reed switch or a mechanical switch having two contacts and connecting wires.

Another benefit of the invention is the ability to compensate for environmental changes such as signal drift and erroneous 'stuck sensor' conditions.

Yet another benefit of the invention is that it provides a small, inexpensive "beeper" switch having an audible output responsive to a user's touch and taking up no more room than a conventional silent switch.

Although it is believed that the foregoing recital of features and advantages may be of use to one who is skilled in the art and who wishes to learn how to practice the invention, it will be recognized that the foregoing recital is not intended to list all of the features and advantages, Moreover, it may be noted that various embodiments of the invention may provide various combinations of the hereinbefore recited features and advantages of the invention, and that less than all of the recited features and advantages may be provided by some embodiments.

BRIEF DESCRIPTION OF THE SEVERAL VIEWS OF THE DRAWING

FIG. 12 is a switching table corresponding to the switch arrangement of FIG. 11, wherein the depicted sequence provides the functionality of FIG. 7 with respect to Cx2, and the functionality of FIG. 9 with respect to Cx1.

FIG. 13 is a switching table corresponding to the switch arrangement of FIG. 11, wherein the depicted sequence provides the functionality of FIG. 9 with respect to Cx2, and the functionality of FIG. 7 with respect to Cx1.

GLOSSARY OF TERMS

The symbols and terms used herein are defined as follows unless specifically noted otherwise within a particular context:

sensor a circuit for measuring the absolute or relative capacitance of either a two-leaded capacitor or of a free-space sense plate, and for providing as an output, a measurement of the capacitance in a usable form. A device only capable of generating a single-bit thresholded "detect" output is still considered a "sensor" for purposes of this disclosure.

sensing the sensing of capacitance by means of a sensor. Of particular interest to the invention is the sensing of "ground referenced capacitance", which refers to capacitance from a sense plate to any object in the environment thereof.

Cx an unknown capacitance to be measured by the sensor. Cx may be either a 2-leaded capacitor or a free-space sense plate. Plural unknown capacitances are referred to as Cx1, Cx2 etc.

Cs a sample capacitor having a fixed value, normally much larger than the value of Cx. One of the two terminals of Cs, hereinafter called the proximal terminal, is connected to Cx. The second terminal of Cs is sometimes referred to hereinafter as the distal terminal. The voltage across Cs is used as an indication of the value of Cx.

switch an electronically controlled switch, which may be a bipolar or field effect transistor ("FET"), relay, optoelectronic device, or similar circuit.

proximity any event or circumstance resulting in a measurable capacitance or a measurable change in capacitance. Specific examples hereinafter provided are often drawn with respect to the physical proximity of a user to a sense plate.

Q The symbol of the fundamental unit of charge, expressed in Coulombs.

QT (Also referred to as charge-transfer) A method of sensing capacitance by transferring electrical charge in a controlled manner by the use of one or more switching elements, which are preferably FETs.

burst a finite, discrete number of QT cycles used to accumulate charge on Cs, where the accumulated charge is representative of the value of Cx. Burst operation differs from continuous QT cycling.

measurement circuit—A voltage sensing means that measures a voltage on Cs and converts that voltage to another form. A "measurement circuit" can be an Analog-To-Digital converter ("ADC"), a simple voltage comparator (which can be viewed as an ADC having only a single output bit), an analog buffer or amplifier chain, etc., all of which are well known in the art. In several of the figures, this element is indicated as a block labeled "MSMT CKT".

controller A control means comprising a circuit or system capable of generating digital control signals. The controller may control the sensor (including control of switching elements therein) and the measurement circuit and may generate a decision output if required. The controller preferably comprises digital logic means such as random logic, a state machine, or a microprocessor.

DETAILED DESCRIPTION OF THE INVENTION

Figures 1, 2:
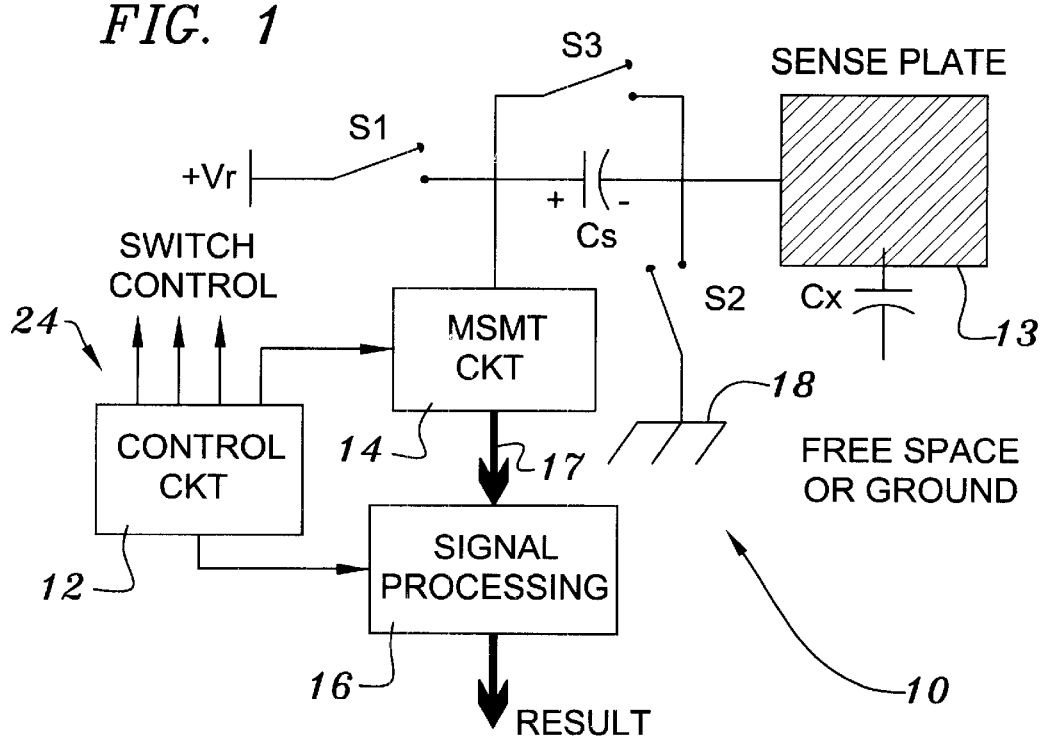
FIG. 1 a schematic block circuit diagram showing an implementation of the invention using three switches.
FIG. 2 a switching table depicting the switching sequence of the three switches of FIG. 1.
Figure 3:
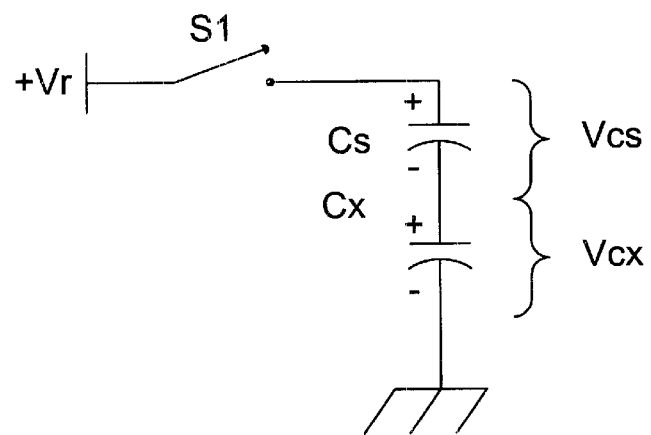
FIG. 3 is a schematic circuit diagram depicting a rearrangement of the circuit of FIG. 1.

Turning now to FIG. 1, one finds a schematic depiction of a first embodiment of the invention 10. In the circuit depicted in FIG. 1 a first switching element, S1, is used to drive electric charge through both a sampling capacitor, Cs, and a capacitance to be measured, Cx, during Step C (as summarized in the table of FIG. 2). This leaves residual charges on both Cs and Cx after S1 opens in step D of FIG. 2. Kirchoff's current law and the principle of charge conservation dictate that these charges, Qx and Qs, are equal. However, because Cs>>Cx, a greater residual voltage is found on Cx, and conversely, a lesser voltage is measured on Cs. FIG. 3 reveals that the arrangement of FIG. 1 may be viewed as a capacitive voltage divider in considering the closure of S1 in step C of FIG. 2.

In FIG. 1, as in some other figures of the drawing, a sense plate 13 is explicitly depicted to indicate that in many uses of the invention the presence or motion of an object that is not part of the apparatus of the invention is to be sensed by a capacitive measurement. Although the drawing sometimes shows both a sense plate 13 and an unknown capacitance, Cx, it will be understood to those skilled in the art that in these depictions Cx is the capacitance of the sense plate 13 to free space or to an electrical ground.

Again referring to the depiction of FIG. 1, a second switching element, S2, is used to clear the voltage and charge on Cs, and also to allow the measurement of Vcs, the voltage across Cs. It may be noted that the use of S2 allows S1 to be cycled repeatedly in order to build up the charge on Cs. This provides a larger measurable voltage value and greater accuracy, increasing sense gain or sensitivity without the use of active amplifiers. A third switching element, S3, acts as a reset switch and is used to reset the charge on Cs prior to beginning a QT burst as explained below.

A preferred control circuit 12 of FIG. 1 controls the switching sequence and also the operation of the measurement circuit 14. A signal processing module, indicated as block 16, may be required to translate an output of the measurement circuit into a usable form. For example, this may involve converting cycle counts to a binary representation of signal strength. The signal processing block 16 may also contain other linear signal processing elements such as filters and/or nonlinear functions such as threshold comparisons as described elsewhere herein, so as to provide an output suitable for an intended application Although the control circuit 12 and processing circuit 16 are depicted only in FIG. 1, it will be clear to those skilled in the art that such circuit elements would be used with the circuits depicted elsewhere in the drawing (e.g., as indicated by the bold output arrow from the MSMT CKT), but that these elements have been omitted in the interest of clarity of presentation.

The table of FIG. 2 shows the switching sequence required in one implementation using the circuit of FIG. 1. First, in step A, switching elements S2 and S3, which were previously in their respective open states, are closed to clear charge on Cs and Cx. After a suitable pause in step A, S1 is closed to drive charge through Cs and Cx (Step C). The resulting first voltage increment across Cs is defined by the capacitive divider equation:

$$\Delta V_{cs}(1) = V_r C_x/(C_s + C_x),\qquad\text{(Eqn. 1)}$$

where Vr is the reference voltage connected to S1.

In Step E of the table in FIG. 2, S2 is closed, and ΔVcs appears as a ground-referenced signal on the positive, distal, terminal of Cs. Deadtime steps B and D are employed to prevent switch cross-conduction, which would degrade the charge build-up on Cs. Deadtime can be quite short, measuring a few nanoseconds, or longer if desired. Steps B through E may be repeated in a looping manner, to provide a "burst" of QT cycles. After a suitable QT burst length, the QT cycle is terminated and Vcs is measured in the aforementioned manner, perhaps by an ADC, in Step F, with S2 closed and the other switches open. Following the measurement of Vcs, S3 may also be closed to reset Cs in preparation for the next QT burst.

In an alternative embodiment, steps E and F of FIG. 2 are combined so that a measurement is made at each QT cycle. This switch sequence variation is also applicable to all the variants of the circuit to be discussed below in conjunction with the remaining figures. By combining steps E and F, which are functionally identical, the measurement circuit can be made to consist of a simple voltage comparator with a fixed reference. In such cases, the looping action of the QT cycles is terminated when the voltage comparison indicates that Vcs has risen above a selected threshold value. The number of cycles taken to reach this point becomes the signal reading. This method is explained in greater detail hereinafter.

During the repeating loop of steps B through E of FIG. 2, voltage builds up on Cs but not Cx. Cx is continuously being discharged in step E, and hence Cx cannot build up an increasing amount of charge. However, Cs freely accumulates charge, so that the resulting incremental voltage is dependent on the difference in the voltages Vr and Vcs as follows:

$$\Delta Vcs(n) = K(Vr - Vcs(n-1)) \qquad \text{(Eqn. 2)}$$

where

Vr is a supply voltage that may be a fixed reference voltage;

n is the QT cycle number; and

K=Cx/(Cs+Cx).

Figure 4:
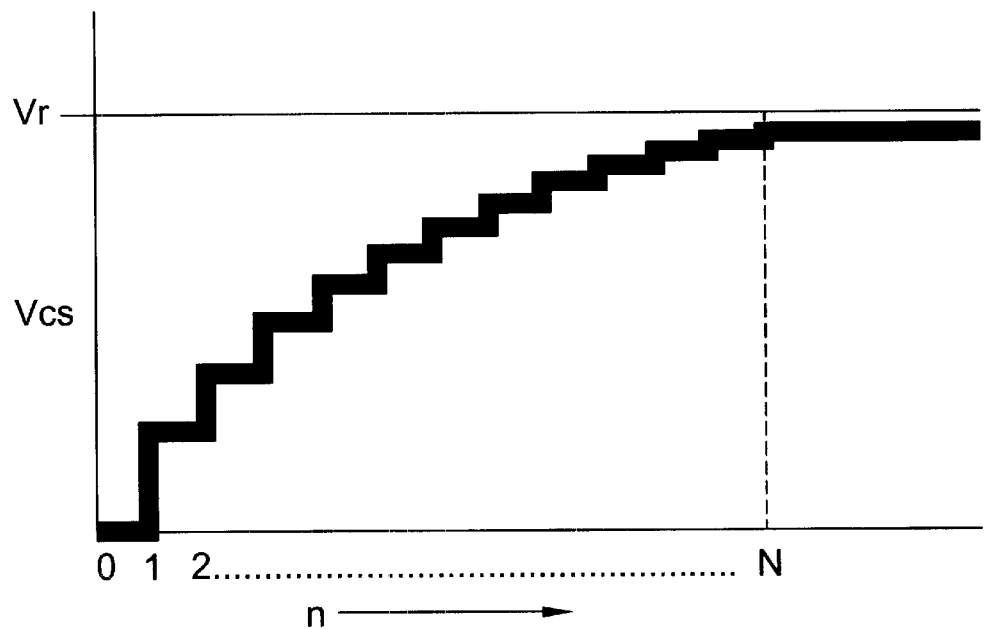
FIG. 4 is a plot of a voltage across Cs as a function of cycle number during a burst-mode operation.

The final voltage across Vcs is equal to the sum of the first value of Vcs plus all subsequent values of ΔVcs. That is:

$$Vcs(N) = \Delta Vcs(1) + \Delta Vcs(2) + \Delta Vcs(3) + \ldots + \Delta Vcs(N) \qquad \text{(Eqn. 3)}$$

or, $$Vcs(N) = \Sigma \Delta Vcs(n) = K\Sigma(\Delta Vr - Vcs(n-1)), \qquad \text{(Eqn. 4)}$$

where the summation runs over the range from n=1 to n=N. During each QT cycle, the additional incremental voltage on Vcs is less than the increment from the prior cycle and the voltage build-up can be described as a limiting exponential function:

$$V(N) = Vr - Vre^{-dn} \qquad \text{(Eqn. 5)}$$

where d is a time scaling factor, as shown in FIG. 4.

In practice, a burst is terminated well before Vcs rises to be approximately the same as Vr. In fact, if the rise in Vcs is limited to <10% of Vr, the linearity can be made acceptable for most applications. For simple limit sensing applications Vcs can be permitted to rise higher, at the expense of increasingly degraded signal-to-noise ratios in the threshold comparison function.

The QT burst can be terminated after a fixed or after a variable number of cycles. If a fixed number is used, the measurement circuit should be capable of representing continuous signals much as in the fashion of an ADC or an analog amplifier. If a variable burst length is used, a simple comparator with a fixed reference can be employed for the measurement circuit, and the length of the burst required is that at which Vcs has built up to a level where it equals the comparison voltage. The burst can continue beyond the required number, but the extra QT cycles are superfluous. A count of the QT cycles required to achieve the comparison voltage is the output result, and for all practical purposes is indistinguishable from an ADC result Note that in FIG. 1 the voltage measuring means 14 is connected to the (+), distal, side of Cs, and the reading is taken when S2 is closed. Although the (+) side of Cs is the most convenient measurement point for a ground-referenced signal, it is also possible to measure Vcs on the (−), proximal, side of Cs by holding S1 dosed instead of S2. The reading is then Vr-referenced instead of ground referenced, which most designers will recognize as being generally inferior but still possible. In either case, the measurement being made is the de facto value of Vcs. Whether the reading is made with respect to ground or Vr is irrelevant to the invention; what is important is the differential voltage across Cs.

Figures 5, 6:
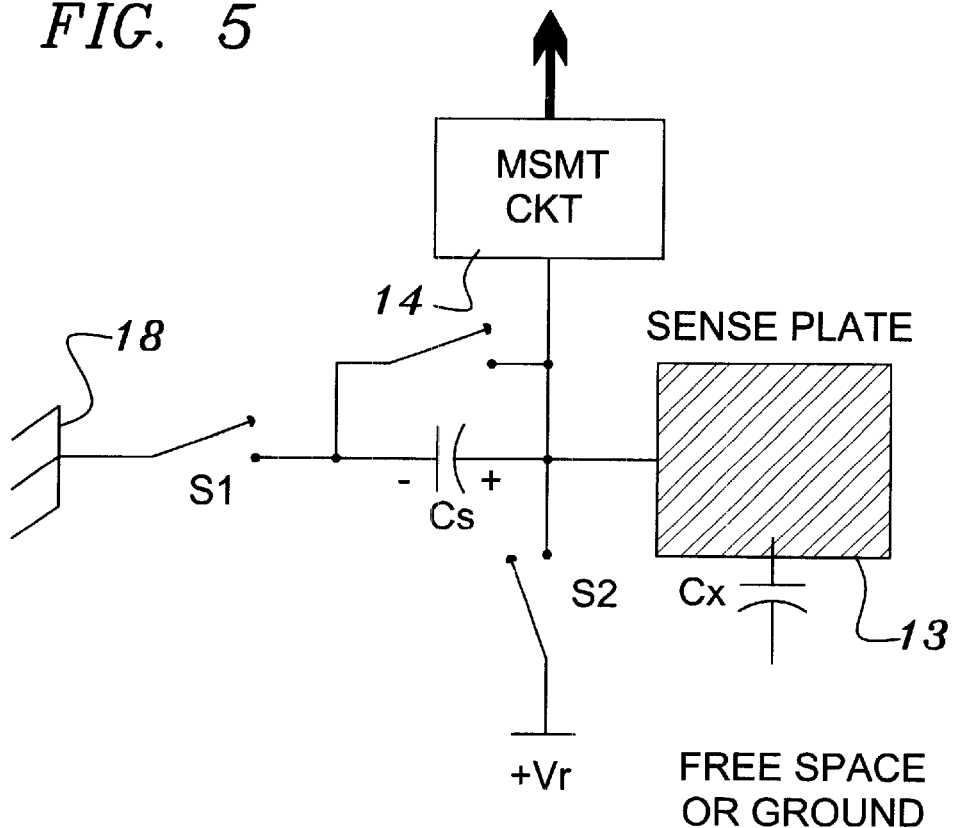
FIG. 5 is a schematic circuit diagram depicting a circuit having topology analogous to that depicted in FIG. 1.
FIG. 6 is a switching table describing the switching sequence of the three switches of FIG. 5.

A switch arrangement similar to that of FIG. 1 is depicted in FIG. 5, where the connections to Vr and the ground voltages are reversed. As depicted in the corresponding switching table of FIG. 6, the charge and transfer operations are separated into two distinct steps C and D, whereas in the circuit of FIG. 1 they were combined in a single step (labeled C in FIG. 2). The circuit of FIG. 5 first charges Cx to Vr, but the charge on Cx is not transferred into Cs until S1 closes. Accordingly the switch sequence is different from that used with the circuit of FIG. 1, but the looping process to create a QT burst requires the same number of steps. Also, the QT equations (Eqn. 1) through (Eqn. 5) hold exactly the same for the circuit of FIG. 5 as for that of FIG. 1. Note that the measurement circuit 14 depicted in FIG. 5 monitors the voltage on the (+) side of Cs. This is the most convenient location to measure a ground-referenced reading of Cs. Moreover, a measurement can also be made on the (−), distal, terminal of Cs by holding S2 closed during the measurement. The comments made above with respect to FIG. 1 apply to these measurements as well.

Figures 7, 8:
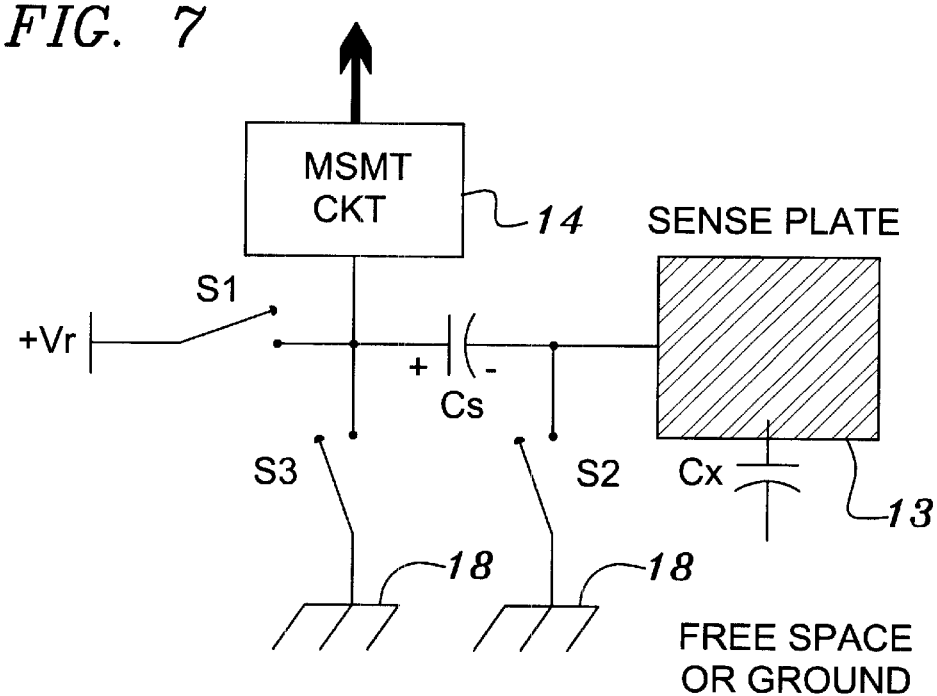
FIG. 7 is a schematic circuit diagram depicting a rearrangement of the switches of FIG. 1.
FIG. 8 is a switching table corresponding to the switch array of FIG. 7.

FIG. 7 shows a variation of the circuit of FIG. 1 that is identical as to form and that illustrates that the circuit of FIG. 1 can be modified slightly without altering its purpose or function. In FIG. 7 the reset switch S3, which had shunted the sample capacitor Cs of FIG. 1, is now a ground-referenced switch. The reset of Cs, as depicted in the corresponding switching table of FIG. 8, is accomplished by holding both S2 and S3 closed, thus shorting both ends of Cs to ground. The net result is absolutely identical to that provided by the circuit of FIG. 1 in all respects, including even the required switching sequence. An advantage of FIG. 7 over FIG. 1 is that the circuit of FIG. 7 has one side of each switching element connected either to the DC power supply, Vr, or to a chassis or circuit ground 18. That is, the circuit of FIG. 7 does not require a floating switch, which is more difficult to manufacture in a CMOS integrated circuit than is a ground or Vr referenced switch. Thus, FIG. 7 represents a preferred embodiment of the circuit of FIG. 1 in most cases. In all the cases disclosed herein, each of the switching elements S1, S2, S3 has both an open state and a single respective closed state.

Figures 9, 10:
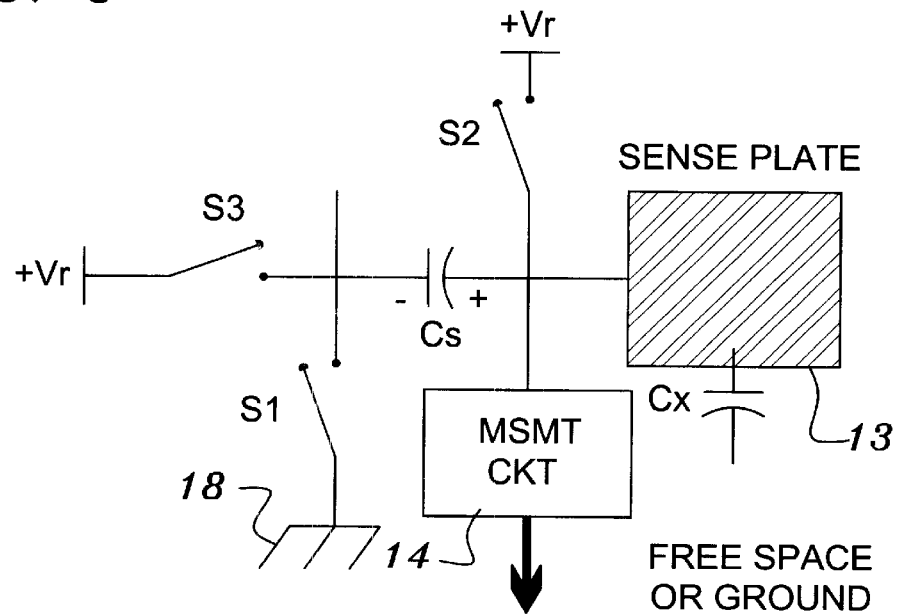
FIG. 9 is a schematic circuit diagram depicting a rearrangement of the switches of FIG. 5.
FIG. 10 is a switching table corresponding to the switch array of FIG. 9.

FIG. 9 similarly alters the basic circuit of FIG. 5 into an all supply-rail referenced switching circuit operated in accordance with the switching table shown in FIG. 10. The circuit of FIG. 9 has the same advantages over that of FIG. 5 that the circuit of FIG. 7 has over that of FIG. 1. Hence, FIG. 9 depicts an embodiment that is preferred to that of FIG. 5 in most cases.

In both FIG. 7 and FIG. 9, a switching element S2 can be reconnected to the opposing supply rail (Vr or ground) with no change in functionality except for the 'reset' step. Variations in switch configuration, as shown in FIGS. 1 through FIG. 5, use the same inventive principles of operation, resulting in identical functionality, and are all well within the scope and spirit of the invention as they do not change the fundamental mechanism of sensing and measurement.

Figure 11:
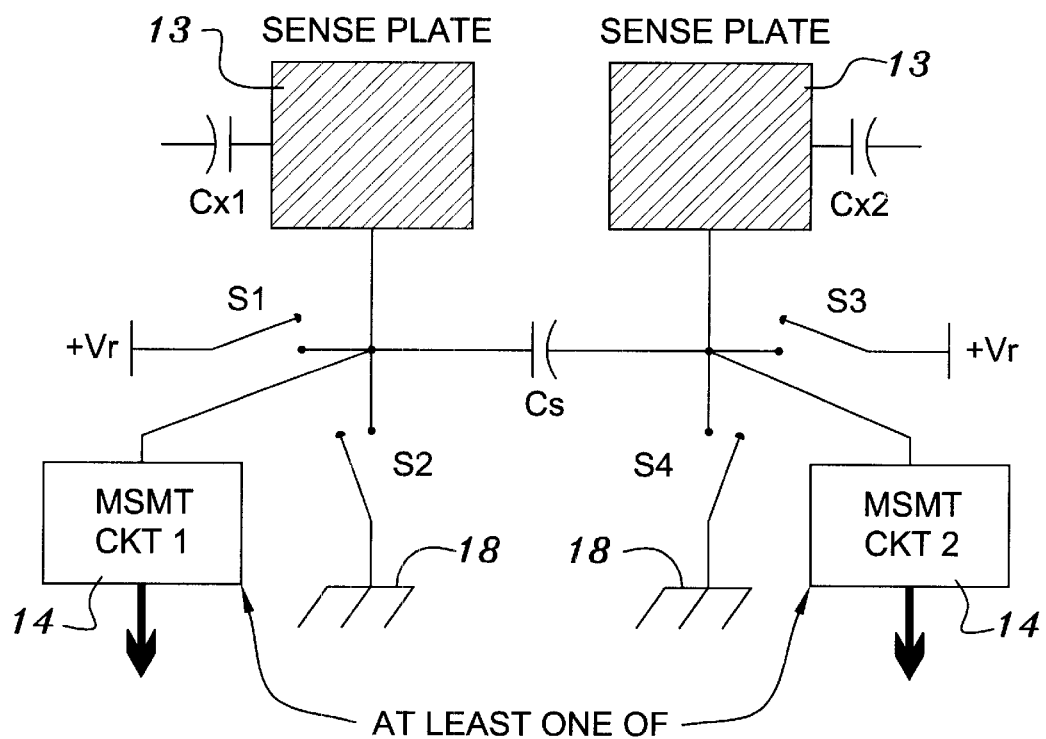
FIG. 11 is a schematic circuit diagram depicting a switch arrangement that can provide the functions of the arrangements depicted in FIGS. 7 and 9, and by inference, those depicted in FIGS. 1 and 5.

FIG. 11 shows a unified version of the circuits of FIG. 7 and 9 and, by inference, the circuits of FIGS. 1 and 5. The circuit of FIG. 11 can be operated in several switch sequences, and the measurement can be made at either terminal of the sample capacitor Cs. The switching tables of FIGS. 12 and 13 show how the circuit can be made to simulate action of any of the circuits of FIGS. 1 though 9. Importantly, the plate capacitance, Cx can be attached to either end of the sample capacitor, Cs, and the circuit will still function. It is also possible to attach two plate loads, Cx1 and Cx2, and to measure the sum of both of these unknown capacitance values at once.

The tables of FIGS. 12 and 13 show two possible switch sequences for the circuit of FIG. 11. The function of each switch state with respect to Cx1 and Cx2 is shown in the right two columns of each table. As can be seen, depending on the position of the load, Cx, the function of each switching stage can be different. If both Cx1 and Cx2 are present, both sets of functions apply simultaneously with respect to the respective Cx. Steps G and G' of FIGS. 12 and 13 depict two different ways of measuring the charge, depending on whether the voltage measurement means 14 is connected as indicated by the block labeled MSMT CKT1 or as indicated by the block labeled MSMT CKT2. Again, it is possible to combine the measurement function specified in G or G' with a prior step, and use a simple voltage comparator circuit along with a cycle counting means to generate a value representative of Cx, as was explained in conjunction with FIG. 1 above.

Several variations of the switching sequence of FIG. 11 are permissible and fall well within the scope of the invention. The inventive aspects of all of FIGS. 1 through 11 comprise the ability to measure charge transfer through the use of a plurality of switches, none of which is interposed between the sample capacitor, Cs, and the unknown capacitance, Cx. Moreover, all of the circuits discussed supra are compatible with the use of repetitive QT cycles to accumulate charge within Cs, thus increasing usable gain, resolution, and intrinsic noise filtering ability (via the inherent mechanism of charge averaging within Cs during the burst).

FIGS. 7 and 9, and by inference FIG. 1 and 5, can be seen as parings-down of the circuit of FIG. 11, i.e., versions that simply have the respective unused switches removed. Examples of superfluous switching elements include the switch labeled S1 in the switching sequence of FIG. 13, and the switch labeled S3 in the switching sequence of FIG. 12. In essence, all of FIGS. 1 through 9 are subsets of the circuit of FIG. 11.

Figure 14:
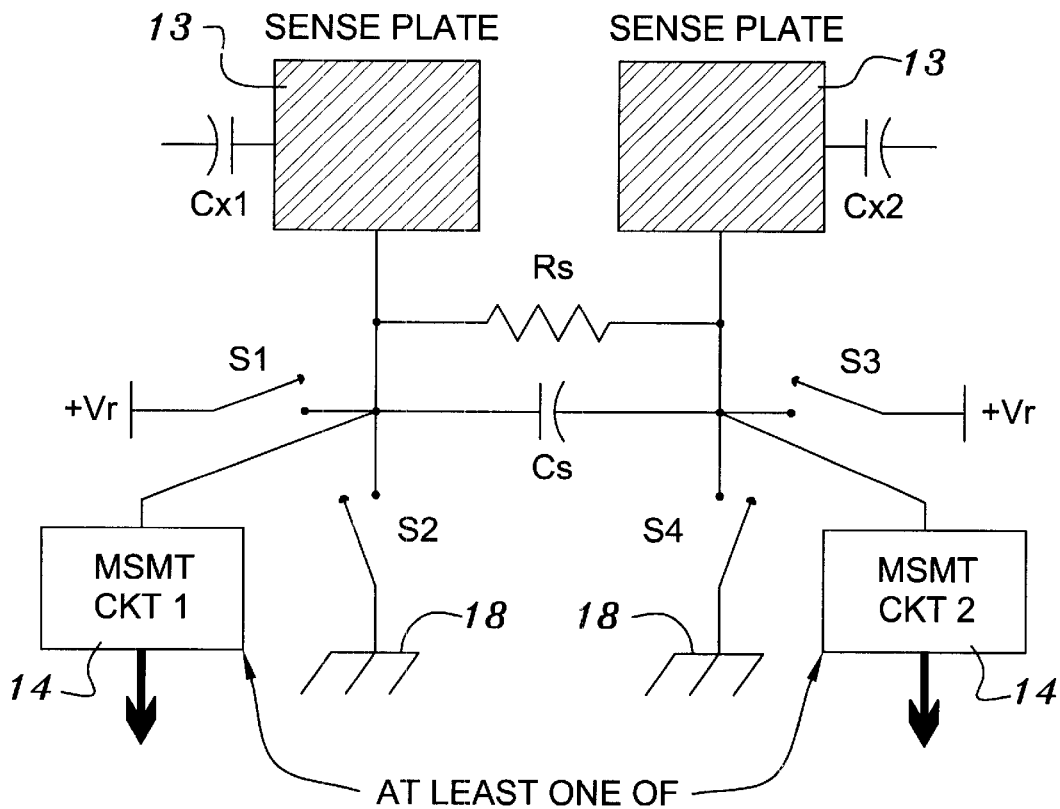
FIG. 14 is a schematic circuit diagram similar to that of FIG. 11, but wherein a resistor is placed across Cs, and the sensor is operated in a continuous ("CW") mode as opposed to a burst mode.

Turning now to FIG. 14, one finds a variation of FIG. 11 that uses a shunting resistor, labeled Rs, that is electrically connected across the sample capacitor, Cs. In this case, the switches must be cycled for a longer duration, or perhaps continuously, to develop a stable voltage across Cs that is representative of the value of Cx. In this circuit, the steady-state average voltage developed across Rs is given by:

$$V_{RS} = f V r\ C x\ R s,\qquad\text{(Eqn. 6)}$$

where $V_{RS} \ll Vr$ and $f$ is the frequency of switch operation.

In this circuit, unlike in burst-mode QT operation, Cs does not play a part in determining gain. Here, Cs only acts to low-pass filter the voltage $V_{RS}$. Hence, Cs must be sized with respect to Rs to make superimposed voltage ripple across Rs appropriately low. The use of a resistor across Cs has the advantage that the measured result is dependent on the stability of the resistor, and not on the stability of Cs. It is generally easier to make stable resistors than to make stable capacitors, so some cost benefit may arise from the use of a circuit such as that depicted in FIG. 14. However, this circuit will normally take longer to acquire signals than will a 'pure' burst-mode circuit, because the voltage across Rs rises asymptotically to a final value. Moreover, the voltage across Rs will lag changes in Cx, a situation that is not encountered in resistor-less versions. Since longer bursts are required to obtain an accurate reading, the sensor will generally be slower to respond, and/or will require more power to obtain a given sensitivity and response time, compared with versions that do not have Rs installed.

It may be noted that any of the circuits of FIGS. 1 through 9 can also be operated with a resistor across Cs.

While many continuous capacitance sensor designs are available in the literature and commercially, they suffer from the disadvantages of requiring continuous power, having a slow response time, and being prone to interference either from external noise sources or from adjacent capacitive sensing units. Therefore, the QT burst mode is generally preferred in most applications, but there may in certain cases be a reason to implement Rs-shunted QT sensing. This small modification is well within the spirit and scope of the invention as it does not alter the basic mechanism of capacitance sensing described herein.

The circuits described supra can be implemented in a standard CMOS process, because all of the switching elements can be MOSFETs of conventional design. Attention should preferably be paid to limiting charge injection by the gates of the transistors to reasonable values. In theory any type of electrical switch will do, but electronic switches (such as MOSFETs) are almost ideal in practice.

The control electronics 12, used to manipulate the switches, can be made from random logic, which may be incorporated into a gate array or similar logic device, or which may be provided as discrete logic circuits. A clocked state machine design can also be used. An important implementation comprises a microcontroller to control the switching action. It is particularly beneficial to use a very fast microcontroller that can create sub-microsecond switching times, in order to create lengthy bursts in a short period of time. Such a controller can also measure and acquire the signal and perform further processing to provide operation of a variety of useful apparatus, such as a touch switch with an audible beeper, or a fluid level sensor.

Because the floating switches of FIGS. 1 and 5 are more difficult to implement in CMOS circuitry, the circuits of FIGS. 7, 9, 11, 14 and 15 are generally easier to implement and thus more desirable.

Measurement means 14 can include A/D converters, comparators, or even the simple input of a logic gate having a more or less fixed threshold level. The final signal value can be derived directly by reading the output result of an A/D converter, or indirectly by counting the QT cycles necessary for Vcs to reach a specific level. The resulting value can be further processed (e.g., via threshold comparison, or filtering and output as an analog or digital representation of the signal level.

Calibration and threshold level determination can be accomplished by simply reading the signal level during presumed quiescent interval and setting the threshold level based on that reading. The threshold may, of course, include a fixed or proportionate offset. If the latter is used, a great deal of insensitivity to absolute load levels can be achieved, which is an important design goal in many systems.

Charge Offsets

Figure 17:
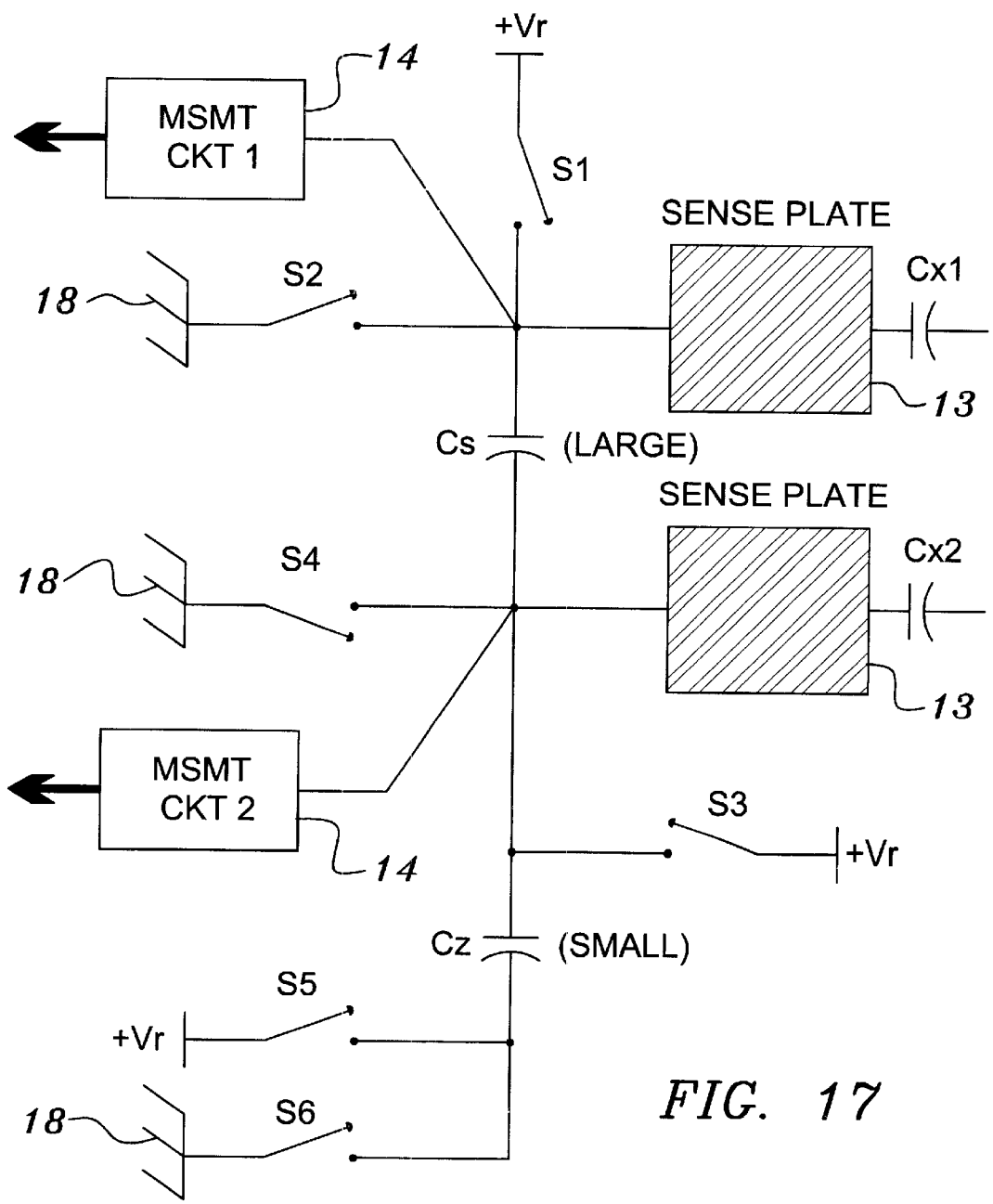
FIG. 17 is a schematic circuit diagram depicting a sensor of the invention incorporating a charge cancellation means.
Figure 18:
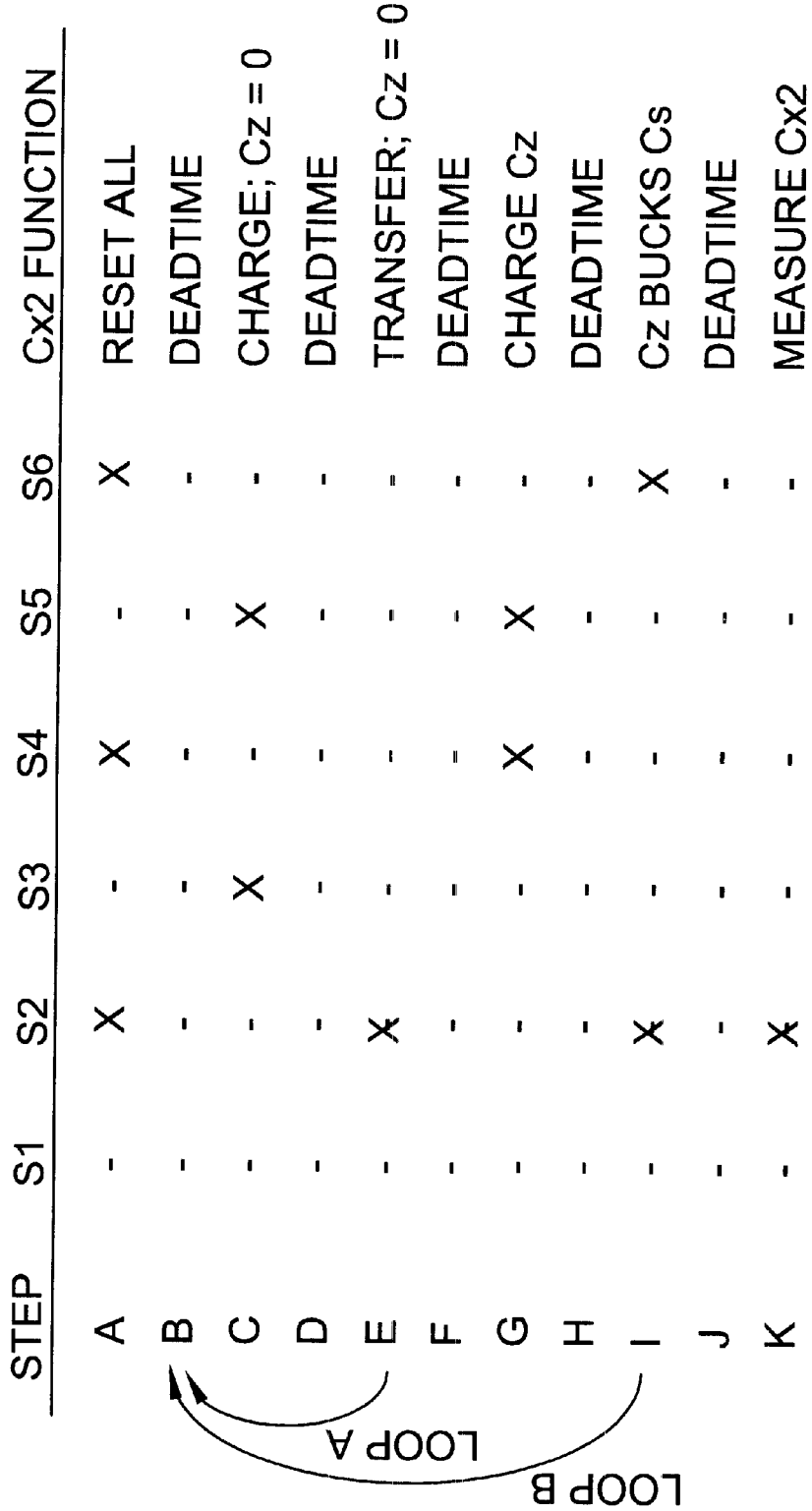
FIG. 18 is a switching table depicting one possible sequence of incorporating charge cancellation in the circuit of FIG. 17.

It is possible to implement charge offsetting in the apparatus of the invention, e.g., so that a sensing device can tolerate larger loads. The need for this technique is described in some detail in my U.S. Pat. No. 5,730,165 which also details a method for accomplishing charge transfer in the context of the implementation therein disclosed. In the context of the present invention, FIGS. 17 and 18 show a version of the sensor that incorporates a simple method of negative charge offsets i.e., charge cancellation. FIG. 17 shows a circuit similar to that of FIG. 11, but with two additional switches, S5 and S6. An exemplar timing sequence for subtracting charge is shown in FIG. 18. During added steps G and I the fixed Cz capacitor is charged, and subsequently discharged into Cs in a manner so as to reduce, or buck, the charge on Cs. This has the effect of canceling the charge buildup due to large capacitive loads, thus extending the possible load range of the sensor. Steps G and I are not required on every QT cycle. These steps are only required after a number of conventional QT cycles have caused a near-excessive accumulation of charge on Cs. These additional steps may be executed within the course of a burst (or every 'n' cycles in the case of a more continuous QT circuit like that of FIG. 14), or on an as-needed basis.

The downside of Cz charge cancellation is that each Cz cancellation also forms a capacitive divider during the time when S5 and S6 are closed. This, in turn, reduces system gain incrementally. However, the circuit allows extended QT bursts to occur, thus raising system gain more than enough to compensate for the loss of gain caused by charge division.

Figure 15:
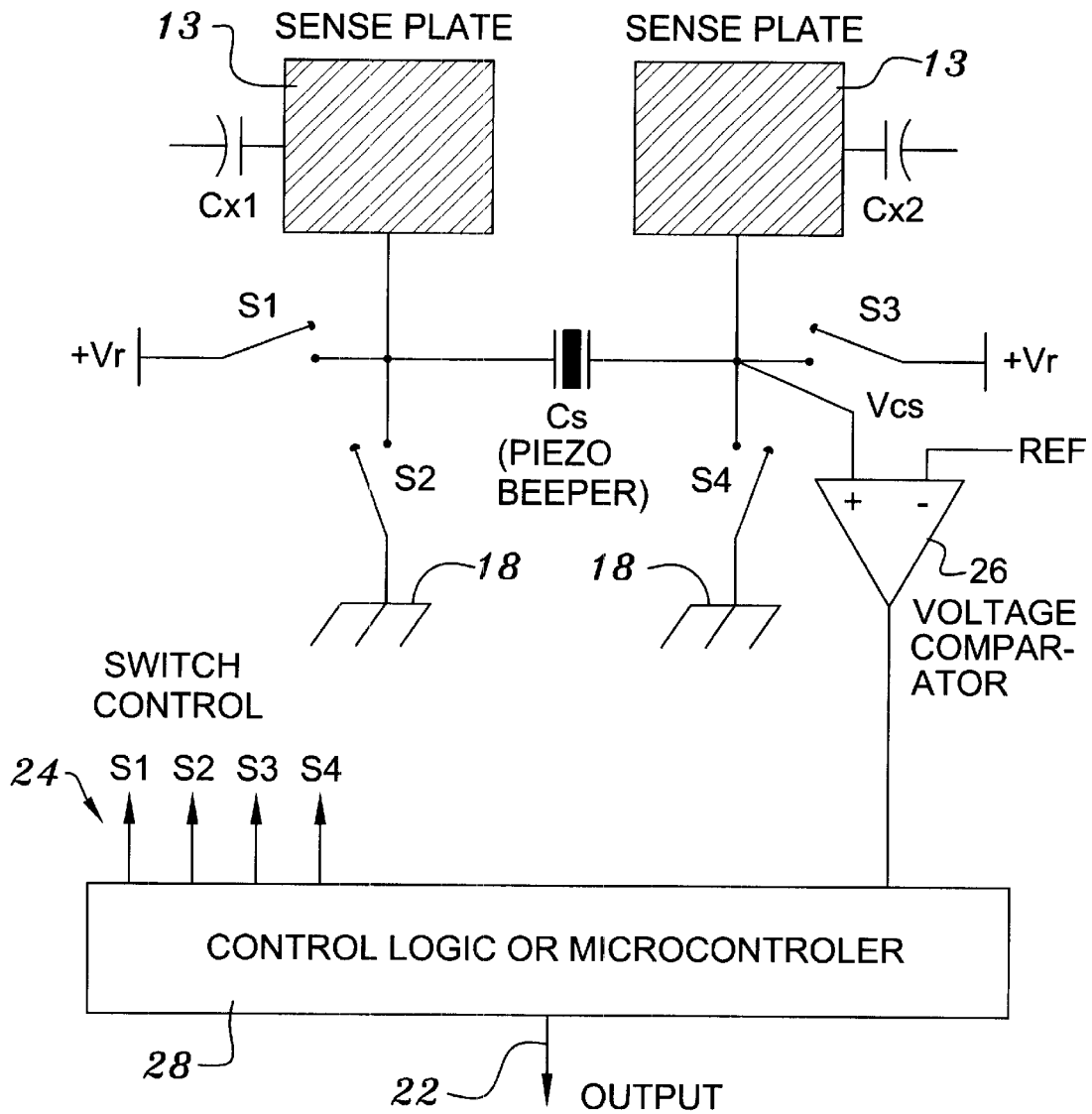
FIG. 15 is a schematic block diagram of an embodiment of the invention wherein Cs is a portion of a piezoelectric transducer, thus providing a touch switch having an audible beeper.

In versions of the sensor that use a simple voltage comparator 26 and rely on counting QT cycles until a threshold voltage across Cs is reached (e.g., as depicted in FIG. 15) it is often desirable to use a positive charge offset when changing the amount of charge in the sample capacitor—i.e., performing charge addition instead of charge subtraction. Although at first glance counterintuitive, charge addition performed early in a burst will allow a truncated burst length while leaving differential sensitivity unchanged. Shortening a burst in this manner is advantageous from the standpoint of reducing power consumption and decreasing response time. To perform charge addition, the sequence shown in FIG. 18 is altered as follows: 1) in Step G, switches S4 and. S6 are closed to discharge Cz; 2) in Step I, switches S2 and S5 are closed, thus injecting charge from Vr through Cz and into Cs . Charge addition can be performed prior to the burst itself, e.g., steps G through I may be performed just after step A and before step B. Only one or a few charge injection cycles are usually required to bring the voltage on Cs to a level just below the threshold comparison level Numerous switch sequences are possible using the circuit of FIG. 17 to accomplish charge offsets in Cs. This encompasses all manner of switching sequences as well as the use of alternate techniques, such as current sources, to provide a selected charge offset in the sample capacitor. The invention is not dependent on any one specific switch sequence, but instead anticipates that charge offsets can be accomplished by numerous means, all of which are more or less equal in intent and function.

Charge cancellation can be applied to any of the circuits of FIGS. 1 through 7, which can be derived by pruning unused switches in FIG. 17 or by substituting electrically equivalent elements, such as switch S3 in FIGS. 1 and 5, as explained supra Touch Switches FIG. 15 shows the circuit of FIG. 11 used as a proximity switch capable of providing audible feedback to a user. In this case the sample capacitor, Cs, comprises a piezoelectric transducer 20 (ie., an audio 'beeper' providing an audible output responsive to an audio frequency AC electric signal applied to its two terminals), which has a characteristic capacitance typically in the range of five to thirty nanofarads. During normal operation the circuit of FIG. 15 samples a value of Cx (i.e., either Cx1 or Cx2 or both) via one of the switching sequences described previously. If an object is thereby detected proximate one of the plates (Cx1 or Cx2), the circuit proceeds to generate an output on the output line 22, and also to cause the audio transducer to briefly beep— e.g., by using the switch control lines 24 to sequentially operate the switching elements S1, S2, S3 and S4 to provide an audio frequency voltage across the beeper 20. Because the beeper 20 is the only external component, the component count is as low as possible, and cost and space are also minimized (in the case of small piezoelectric beepers, an additional capacitor may have to be placed in parallel with the beeper to 'top up' the total capacitance used for Cs). Indeed, it is possible to house the entire assembly within the confines of an ordinary switch body by using well-known construction techniques such as chip-on-board assembly, or by mounting the IC directly on the piezoelectric element 20 itself. Alternatively, the circuit can be housed adjacent a metallic electrode on the inside of a control panel made of plastic, wood, or other insulating material, and the contact area marked as a legend on the user side. The sense field will penetrate through the insulating panel and create a proximity field on the user side.

The measurement circuit 14 depicted in FIG. 15 can be a simple voltage comparator 26 having a fixed threshold level as one of its two inputs. In this case the signal strength reading is obtained digitally by counting the number of QT cycles required to accumulate enough voltage on Cs so as to exceed a selected comparison threshold. The number of cycles required to cause this is an inverse digital representation of capacitance—that is, the fewer the number of QT cycles required to exceed the comparison threshold, the higher the capacitance, which in turn is proportionately related to proximity. Once the capacitance has fallen to a lower level again, the output is made to cease. This method of signal determination is not unique to touch switch applications, and can be employed for all manner of other applications.

Another control version might make use of a higher resolution measurement of Vcs after a burst. In this case Vcs would be compared to a stored threshold level to make a detection determination. The measurement circuit can consist of an ADC, or possibly a voltage comparator whose secondary input is a variable comparison level controlled by an algorithm in order to form a successive approximation converter.

In a preferred embodiment the controller can cycle the switches S1, S2, S3, S4, at a suitable audio drive frequency to drive the beeper for the duration of a momentary 'beep', at for example 4 kHz, a common resonant frequency of audio beepers. The capacitive signal acquisition process should occur at a higher frequency that is well above the range of resonance in order to be inaudible. In any case, the differential voltage applied across Cs during signal acquisition is on the order of millivolts, so that even if acquisition were to occur in the beeper's acoustic range it would be barely audible. Moreover, it is recognized by those skilled in the art that other known drive means, such as an audio frequency AC voltage source controlled by the controller, could also be employed to generate the audio output.

Figure 16:
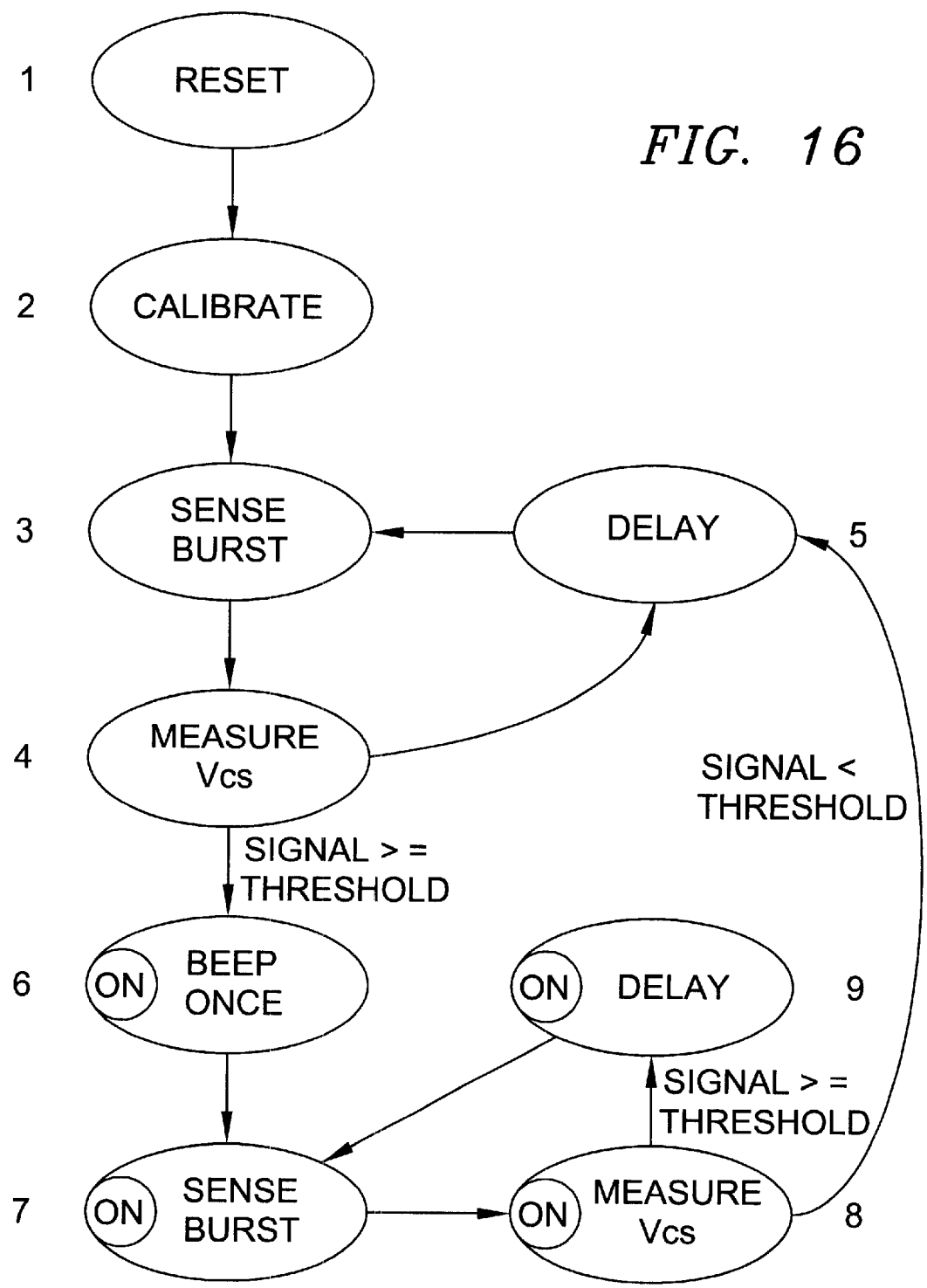
FIG. 16 is a flow diagram depicting the operation of the circuit of FIG. 15.

FIG. 16 shows a sample of a possible flow diagram for the control logic or microcontroller 28 used in the arrangement depicted in FIG. 15. In state 1, the device is reset after an initial power-up. State 2 is a calibration step wherein the logic acquires the value of Cx and sets both an internal reference level and a threshold level for later comparison. The threshold level is suitably distant in value from the reference level so that an appropriate increase in Cx will trigger the output during a later state. State 3 causes the QT burst to occur during an actual sensing cycle. The resulting signal, Vcs, is compared with the previously determined threshold level in state 4. If the signal is less than the threshold level, no output is generated, and the device delays in state 5 until a new sense burst is required. This delay can suitably be a 'sleep' mode having low power. If, in state 4, the signal is found to be greater than the threshold level, the unit is made to beep and the output line is activated in state 6. A looping pattern involving states 7, 8, and 9 then takes place in a fashion similar to that involving states 3, 4, and 5, so that the output will remain 'ON' until the signal reduces below a threshold level. Note that states 6 through 9 are labeled 'ON' to indicate that an active detection has been sensed, and the output line is made active.

Further improvements can be made by incorporating additional post-acquisition algorithms and other features such as:

Toggle mode: the sensor circuit provides a bistable output which is presented as a persistent logic '1' when first touched, then a logic '0' when touched again, thus simulating the action of a bistable mechanical switch ("touch-on, touch-off" mode).

Auto recalibration after time-out: after an interval of preset duration of continuous sensing, the sensor circuit recalibrates itself so as to terminate its active output, recalibrate, and thereafter become sensitive to only new touches which increase signal strength beyond the point of the most recent calibration.

Drift compensation: the sensor circuit can continuously adjust its threshold in accordance with slow changes that affect signal strength. These changes may include temperature fluctuations, moisture buildup, or mechanical creep, etc. This can be accomplished by altering the reference level slowly at a slew-rate limited rate when no detection is being sensed.

Hysteresis: to prevent 'contact bounce' the sensor can incorporate detection threshold hysteresis, so that the initiation detection level is different, i.e. higher, than the non-detection level, thus requiring the signal to transit though a lower signal level than the threshold level before a 'no detect' state is entered.

The above features and algorithms are also useful in various combinations and degrees in conjunction with any of the circuits described herein, to provide a more robust sensing solution that can adapt to a variety of real-world sensing challenges, such as dirt accumulation, thermal drift, etc.

2-Wire Interface Switch

The sensor of the invention can be configured to run from two metallic connections, 32, 33 e.g., wires or printed wiring board traces, and thereby to directly replace magnetic reed switches or mechanical switches having only two contacts and two control lines. As is well known in the control arts, inputs from such switches are processed by a variety of host equipments 30 that are responsive to the input. Known host equipments 30 include, but are not limited to machine tool (e.g., stamping press) controllers, elevator controls, and automatic washroom valve controls, to name a few. The prior art requirement for a third connection to a capacitive sensor (e.g., separate wires for power, ground, and output) can sometimes cost more than an application will support. A low power QT circuit, as described herein, can be converted to two-wire operation as shown in FIG. 19.

Figure 19:
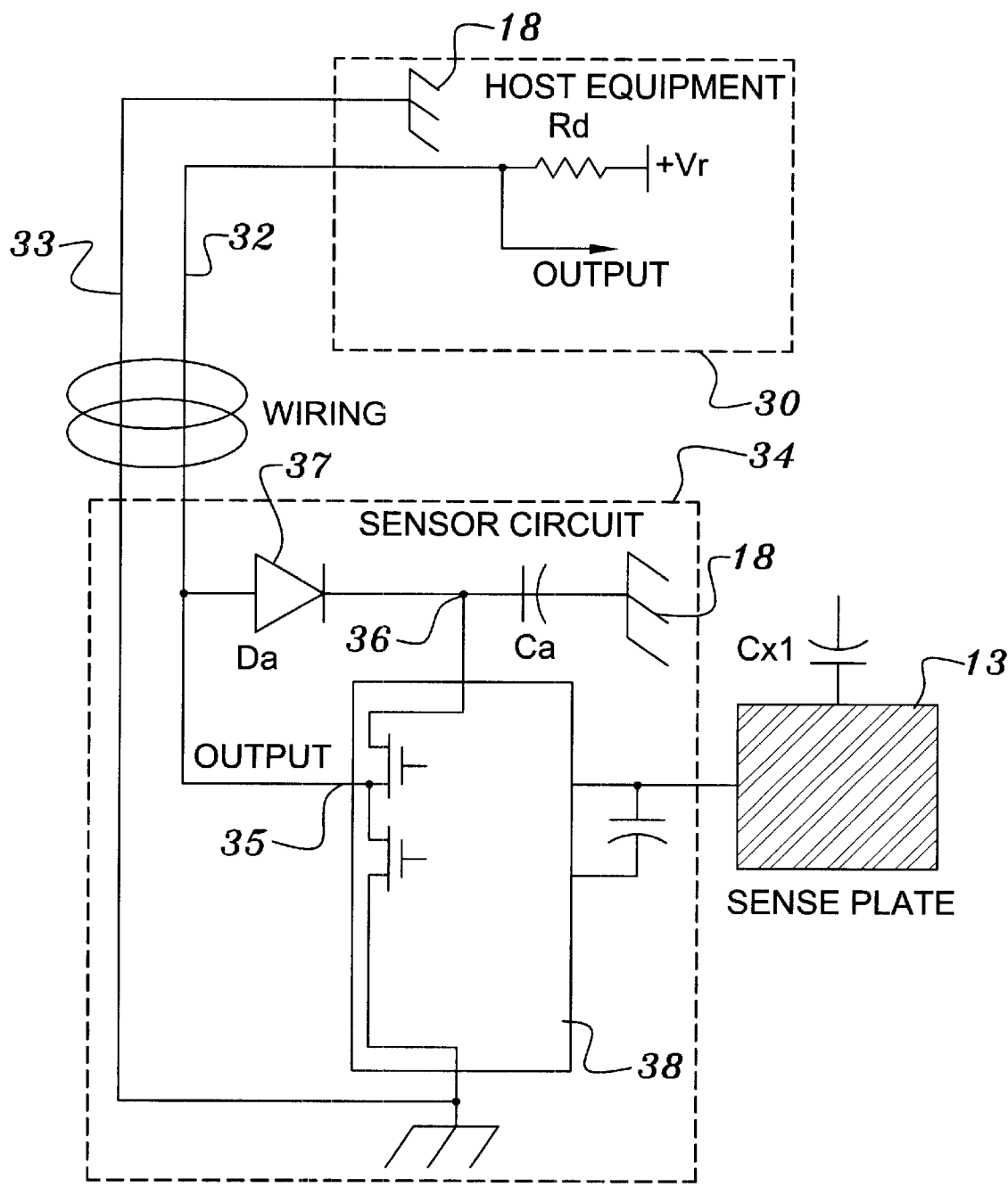
FIG. 19 is a schematic block diagram depicting a 2-wire configuration of the sensor.

As depicted in FIG. 19, a series resistor, Rd, is inserted in series with the signal lead 32 in or near whatever host equipment 30 is to process the signal from the sensor 34. The sensor self-powers from the signal lead 32. Inasmuch as the sensor 34 only requires a few microamps of current, an insignificant voltage drop occurs across Rd. The sensor 34 has associated with it a supply capacitor, Ca, connected between the signal/power lead 32 and a chassis ground 18. The resistor-fed power is connected directly to the output 35 of the sensor, and the anode 37 of a diode, Da. The diode, Da, is connected between the power/signal lead 32 and the electrical power input 36 (Vcc) lead of the QT capacitive measurement circuit 38. Also, as depicted in FIG. 19, the cathode of the diode, Da, is also connected to the positive side of a supply capacitor, Ca. The sensor is normally off, in which state the output signal line 32 is forced high (using the signaling definition of "output high"="inactive") so that the signal line 32 is shorted to the Vcc line 36 via the IC's upper internal mosfet (p-channel) drive transistor.

When an object is proximate the plate 13, the internal control logic forces the signal lead 32 to ground for a brief period (e.g., 100 milliseconds) after which the voltage on the signal lead 32 rises again. During this brief interval the power stored in the supply capacitor, Ca, does not drop much, and hence the sensor IC 38 remains under power. After the conclusion of the signal interval the sensor output goes high again, Ca is quickly recharged to its full value, and the device continues to function as a sensor. It will be understood that a second brief delay, for example another 100 ms, may be introduced at this point in the cycle in order to allow the voltage on the supply capacitor, Ca, to stabilize. The 100 ms activation pulse is detected easily by the host equipment 30 as a low logic level on a logic gate or control port pin. The durations specified above are merely illustrative examples.

In the illustrated circuit, the diode Da is used to provide power to the circuit on first power-up, when the circuit is not yet operational, and the p-mosfet is not yet conducting. After the circuit begins to run, Da is no longer used.

It should be noted that an external diode like Da is not usually required as a separate component Most logic IC's have internal electrostatic discharge (ESD) clamp diodes connected between the I/O pins to their Vcc. An ESD diode would suffice perfectly for the charging the supply capacitor. Thus, the sensor 34 really only requires one additional external part, Ca, and the host 30 only one additional component, a resistor, Rd, both of which are extremely inexpensive and small.

Those skilled in the art will observe that one could construct an equivalent circuit powered by a negative voltage source and having a diode connected in the opposite polarity to that depicted in the drawing.

The two-wire interface can also communicate more extensive data, for example signal strength, using one of many available binary sequential codes that are known in the art.

Analog Output

The value on Cs after a burst can be sampled via a sample-and-hold circuit to create a steady-state analog representation of the signal, preferably (but not necessarily) involving some form of amplification to normalize the signal into a common voltage range, e.g., 0 to 5V. Alternatively, the signal can be reconstructed from a digital representation within the circuit, perhaps after one or more filtering steps, and can be sent to a Digital to Analog converter (DAC) and then output for further use. Both an analog output and a binary decision output can be generated with the same overall circuit if desired.

Multiplexing

A sensor of the invention can be multiplexed if desired to acquire signals from two or more channels. This can be done simply by adding an analog multiplexer ("mux") to either or both of the ends of Cs, and controlling the mux in some sequence to interrogate all desired sensing plates (e.g., plural touch pads on the rear of a control panel). The analog mux can be powered from a single rail supply comparable to that of the sensing electronics. The readings obtained by the circuit can be time-correlated with each sense pad selected in order to obtain a measure of the load at each one. The mux can be controlled either by the sensor's own control means, or by an external controller.

Multiple Channel Sensor

Several sensing channels can be incorporated onto a single IC. Only two pins are required per sense channel. For example, an 8-channel sensor can be implemented in an IC package having only twenty-two pins (including power and ground). The output in such a device can be expressed as three parallel binary lines plus a strobe line that changes its output state when proximity is sensed. These signals could be non-multiplexed, resulting in simple circuit control and simplicity of use. The means of signal output are not important to the invention. For example, serial communication means can be employed to convey the results to a host system.

Level and Material Sensing; Gauging

Figure 20:
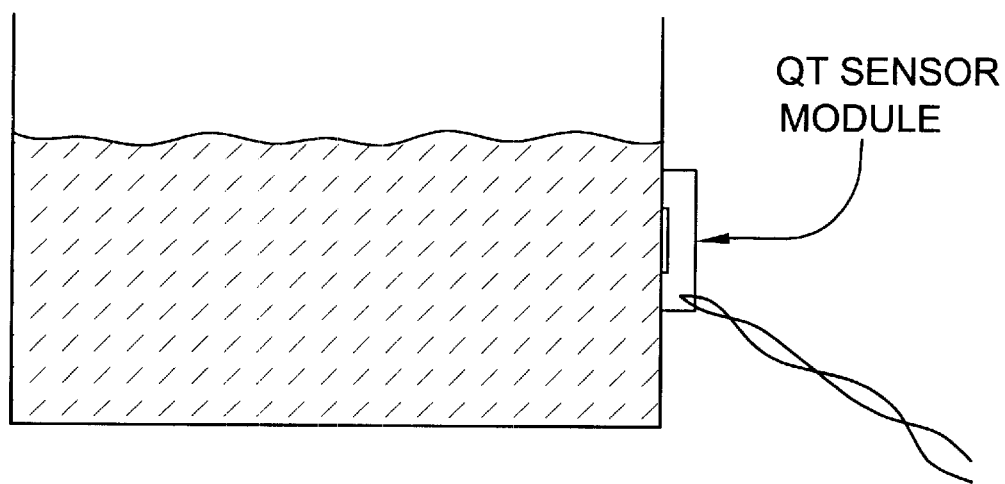
FIG. 20 is a schematic view depicting a sensor of the invention being employed to monitor the level of fluid in a glass or plastic tank.

Another important use of the methods disclosed herein is for level sensing, whereby a metal electrode is placed inside or on the exterior surface of a vessel (FIG. 20). Point level sensing is simple to achieve, but a sensor having a linear response can also be fashioned by making use of the digital results of the measurement circuit and associated techniques, for example by QT cycle counting, or the use of an ADC.

The method is not restricted to level sensing. Material proximity, elevation, or distance gauging in a general sense can be provided economically using the sensor. The internal algorithms required for such applications are, of necessity, different from those for a practical touch switch, but these are elements of detail rather than substance, and should not be deemed as restricting the practice of the invention to any one application.

The invention can be used with all manner of applications normally implemented using alternative capacitive sensing circuits known in the electronic circuit design arts. Additionally the cost and size benefits of the circuit may facilitate new applications for capacitance sensing that remain unexplored, for example the Touch Switch detailed above.

Although the present invention has been described with respect to several preferred embodiments, many modifications and alterations can be made without departing from the invention. Accordingly, it is intended that all such modifications and alterations be considered as within the spirit and scope of the invention as defined in the attached claims.

What is claimed is:

1. Apparatus for measuring the capacitance to ground of a plate, the apparatus comprising:
   at least three switching elements, each of the at least three switching elements having both a respective open state and a single respective closed state, each of the at least three switching elements electrically connected to one of two distinct reference voltages;
   a sample capacitor having two terminals, a proximal one of the two terminals connected to the plate by means not comprising one of the switching elements, the second terminal distal from the plate;
   a voltage measurement circuit connected to one of the terminals of the sample capacitor by means not comprising one of the switching elements, the measurement circuit comprising one of a logic gate and a voltage comparator;
   wherein:
      a first of the at least three switching elements connects the distal terminal of the sample capacitor to the first reference voltage when in its closed state and disconnects the distal terminal from the first reference voltage when in its open state;
      a second of the at least three switching elements connects the proximal terminal of the sample capacitor to the second reference voltage when in its closed state and disconnects the proximal terminal from the second reference voltage when in its open state; and
      the third of the at least three switching elements connects the distal terminal of the sample capacitor to the second reference voltage when in its closed state and disconnects the distal terminal from the second reference voltage when in its open state; the apparatus further comprising
         a controller for operating the at least three switching elements so that at any time at least one of the at least three switching elements is in its respective open state.

2. The apparatus of claim 1 wherein the first reference voltage is an electric ground and wherein the second reference voltage is a DC supply voltage.

3. The apparatus of claim 1 wherein the first reference voltage is a DC supply voltage and wherein the second reference voltage is an electric ground.

4. The apparatus of claim 1 wherein the third switching element connects the distal terminal of the sample capacitor to the proximal terminal thereof when in its closed state.

5. The apparatus of claim 1 wherein the third switching element is in its respective closed state only when the second switching element is also in its respective closed state.

6. The apparatus of claim 1 wherein each of the at least three switching elements comprises a respective field effect transistor and wherein the controller further comprises a clocked voltage pulse source.

7. The apparatus of claim 1 further comprising a shunting resistor electrically connected between the distal and proximal terminals of the sample capacitor.

8. The apparatus of claim 1 wherein the sample capacitor comprises a portion of a piezoelectric transducer and wherein the controller applies an audio frequency AC voltage to the piezoelectric transducer responsive to the output.

9. Apparatus for measuring the capacitance to ground of a plate, the apparatus comprising:
- a sample capacitor having two terminals, one of the two terminals directly connected to the plate by means not comprising an electric switching element;
- a voltage measurement circuit connected to one of the two terminals of the sample capacitor;
- a circuit ground;
- a source of DC electric power,
- a plurality of the electric switching elements, each of the switching elements having both a single respective closed state in which it connects one of the terminals of the sample capacitor only to one of the source of DC electric power and the circuit ground, each of the switching elements further having a respective open state in which it does not connect the one of the terminals to either the source of DC electric power or the circuit ground; and
- a switch controller for selectively closing ones of the plurality of electric switching elements.

10. The apparatus of claim 9 wherein the voltage measurement circuit comprises an analog to digital converter.

11. The apparatus of claim 9 wherein each of the switching elements comprises a respective field effect transistor and wherein the apparatus further comprises a clocked voltage pulse source having an input to the switch controller.

12. The apparatus of claim 9 further comprising
- a second capacitor having a capacitance value less than that of the sample capacitor; and
- means for charging and discharging the second capacitor so as to offset charge in the sample capacitor.

13. Apparatus for providing an audible output responsive to proximity of an object that is not part of the apparatus, the apparatus comprising:
- a circuit ground;
- at least three electric switching elements;
- a piezoelectric transducer having two terminals, the transducer providing an audible output responsive to an audio frequency electric signal applied to the two terminals;
- a capacitive plate having a first value of an electrical capacitance to earth ground when the object is proximal to the plate and having a second value of the electrical capacitance to the earth ground when the object is distal therefrom, the plate electrically connected to one of the two terminals of the transducer by means not comprising any of the at least three switching elements;
- a switching element controller for selectively controlling the at least three switching elements, each of the at least three switching elements having both a single respective closed state and a respective open state, each of the at least three switching elements directly electrically connected to one of the circuit ground and a reference voltage distinct therefrom; wherein:
    - a first of the at least three switching elements, when in its respective closed state, connects the first terminal of the transducer to a reference voltage other than the circuit ground, the first switching element, when in its an open state, not connecting the first terminal to the reference voltage other than the circuit ground;
    - a second of the at least three switching elements, when in its closed state, connects the first terminal of the transducer to the circuit ground, the second switching element, when in its open state, not connecting the first terminal to the circuit ground; and
    - the third of the at least three switching elements, when in its closed state, connects the second terminal of the transducer to the circuit ground, the third switching element, when in its open state, not connecting the second terminal to the circuit ground;
- a voltage measurement circuit connected to one of the terminals of the transducer; and
- means responsive to the voltage sensing means for applying the audio frequency signal to the transducer.

14. The apparatus of claim 13 wherein each of the at least three switching elements comprises a field effect transistor and wherein the switching element controller comprises a clocked voltage pulse source.

15. The apparatus of claim 13 wherein the switching element controller selectively controls the at least three switching elements at a frequency greater than the audio frequency.

16. The apparatus of claim 13 wherein the third switching element is controlled by the controller to be in its respective closed state only when the second switching element is also in its respective closed state.

17. The apparatus of claim 13 wherein the voltage measurement circuit comprises an analog to digital converter.

18. The apparatus of claim 13 wherein the means for applying the audio frequency signal comprises a clocked voltage pulse source having a selective output to each of the at least three switching elements.

19. Sensing apparatus for sensing a change in the capacitance to earth ground of a plate, the apparatus comprising:
- a first metallic connection connecting the plate to a sample capacitor;
- a second metallic connection for connecting an external apparatus, distinct from the sensing apparatus, to a circuit ground of the sensing apparatus;
- a third metallic connection for connecting the external apparatus to an output of a charge transfer measurement circuit, the third connection having attached thereto a first terminal of a diode having two terminals, the second terminal of the diode attached both to a first terminal of a supply capacitor and to the charge transfer measurement circuit, the supply capacitor having a second terminal connected to the circuit ground;
- wherein the charge transfer measurement circuit comprises means for repetitively charging the plate and means for measuring a voltage on the sample capacitor, the charge transfer circuit connecting the output to the circuit ground responsive to the capacitive change; and
- wherein the external apparatus is connected to the sensing apparatus only by the second and the third metallic connections.

20. The apparatus of claim 19 wherein the means for charging the plate comprises a field effect transistor controlled by a source of voltage pulses.

21. The apparatus of claim 19 wherein the means for measuring the voltage comprises an analog to digital converter.

22. The apparatus of claim 19 wherein the external apparatus comprises a DC voltage source that is connected to the third metallic connector through a series resistor.

23. Apparatus for detecting the proximity of an object to a plate and for supplying a control output responsive thereto, the apparatus comprising:

a host equipment for supplying the control output responsive to a signal received on a signal line connected to a capacitive sensor distinct from the host equipment, the host equipment comprising a host circuit ground and a source of DC voltage electrically connected to the signal line;

a ground conductor for connecting a circuit ground of the capacitive sensor circuit to the host circuit ground;

the capacitive sensor electrically connected to the plate, the capacitive sensor comprising means for measuring the capacitance to ground of the plate, the means for measuring the capacitance having an electrical power input connected to a first terminal of a diode, a second terminal of the diode connected to the signal lead, the first terminal of the diode additionally connected to a first of two terminals of a supply capacitor, the second terminal of the supply capacitor connected to the sensor circuit ground; and means for generating the signal by connecting the signal line to the sensor circuit ground for a selected period;

wherein the signal lead and the ground lead are the only two conductors electrically connecting the capacitive sensor to the host equipment and wherein the capacitive sensor is electrically powered from the signal lead.

24. The apparatus of claim 23 wherein the source of DC voltage is connected to the signal line through a series resistor.

25. The apparatus of claim 23 wherein the means for measuring the capacitance comprises charge transfer means comprising a source of voltage pulses and a switching means for transferring charge from the plate into a charge detector.

26. A method of measuring a capacitance to earth ground of a plate connected to a proximal one of two terminals of a sample capacitor, the other one of the two terminals of the sample capacitor being distal from the plate, the method comprising the sequentially executed steps of:

a) closing both a first switch and a second switch, the first switch, when closed, connecting a first of the two terminals of the sample capacitor to a circuit ground, the second switch, when closed, connecting the distal terminal of the sample capacitor to the proximal terminal thereof;

b) opening both the first and the second switches;

c) closing a third switch to connect the second of the two terminals of the sample capacitor to a reference voltage;

d) waiting a selected interval, and then opening the third switch;

e) closing the first switch to thereby connect the first terminal to the circuit ground; and f) measuring a voltage at the second of the two terminals of the sample capacitor, the voltage representative of the capacitance to earth ground of the plate.

27. The method of claim 26 wherein the first terminal of the sample capacitor is proximal to the plate and is directly connected thereto.

28. The method of claim 26 wherein the first terminal of the sample capacitor is distal from the plate.

29. The method of claim 26 further comprising a step e1 intermediate steps e) and f), comprising repeating steps b) through e) a selected number of times.

30. The method of claim 26 further comprising a step after any one of steps b), d), or e) of providing a selected charge offset in the sample capacitor.

31. A method of measuring a capacitance to earth ground of a plate connected to a first terminal of a sample capacitor having two terminals, the first terminal of the sample capacitor connected to a circuit electric ground when a first switching element attached thereto is closed; the second terminal of the sample capacitor connected to the circuit ground when a second switching element connected thereto is closed, the second terminal of the sample capacitor connected to a supply voltage when a third switching element connected thereto is closed; the method comprising the sequentially executed steps of:

a) resetting the sample capacitor by closing the first and second switching elements and thereby connecting both the first and the second terminals to the circuit ground;

b) opening the first and the second switching elements;

c) charging the sample capacitor by closing the third switching element to connect the second terminal of the sample capacitor to the supply voltage, waiting an interval having a selected duration and thereafter opening the third switching element;

d) closing the first switching element to connect the first terminal to the circuit ground; and e) measuring a voltage at the second terminal of the sample capacitor.

32. The method of claim 31 further comprising a step f), subsequent to step e), comprising repeating steps b), c), d) and e) a selected number of times.

33. The method of claim 31 further comprising a step d2), subsequent to step d) of repeating steps b), c), and d) a selected number of times.

34. The method of claim 31 further comprising a step prior to step c) of injecting a selected quantity of charge into the sample capacitor.

35. The method of claim 31 further comprising a step prior to step e) of changing the amount charge in the sample capacitor by a selected amount.

36. A method of measuring a capacitance to earth ground of a plate connected to a first terminal of a sample capacitor having two terminals, the first terminal of the sample capacitor connected to a supply voltage when a first switching element attached thereto is closed; the second terminal of the sample capacitor connected to the supply voltage when a second switching element connected thereto is closed, the second terminal connected to a circuit ground when a third switching element connected thereto is closed; the method comprising the sequentially executed steps of:

a) resetting the sample capacitor by closing the first and second switching elements and thereby connecting both the first and the second terminal to the supply voltage;

b) opening the first and the second switching elements;

c) charging the sample capacitor by closing the first switching element to connect only the first terminal to the supply voltage for an interval having a selected duration and thereafter opening the first switching element;

d) closing the third switching element to connect the second terminal to the circuit ground; and e) measuring a voltage at the first terminal of the sample capacitor.

37. The method of claim 36 further comprising a step f), subsequent to step e), comprising repeating steps b), c), d) and e) a selected number of times.

38. The method of claim 36 further comprising a step d2), subsequent to step d) of repeating steps b), c), and d) a selected number of times.

39. The method of claim 36 further comprising a step prior to step c) of changing the amount charge in the sample capacitor by a selected amount.

* * * * *